United States Patent [19]

Minarik et al.

[11] Patent Number: 4,739,290

[45] Date of Patent: Apr. 19, 1988

[54] VARIABLE ANALOG DELAY LINE

[75] Inventors: Ronald W. Minarik, Lutherville; Frederick H. Harris, Crofton; Robert R. Willmore, Millersville, all of Md.

[73] Assignee: The United States of America as represented by the Secretary of the Air Force, Washington, D.C.

[21] Appl. No.: 927,021

[22] Filed: Nov. 5, 1986

[51] Int. Cl.$^4$ .............................................. H03H 9/42
[52] U.S. Cl. .................... 333/152; 333/101; 310/313 R
[58] Field of Search ............... 333/150, 152, 155, 103, 333/101, 104, 81 R, 262; 310/313 R, 313 B, 313 C, 313 D; 307/259

[56] References Cited

U.S. PATENT DOCUMENTS

| | | | |
|---|---|---|---|
| 2,576,026 | 11/1951 | Meacham | 307/259 X |
| 3,593,205 | 7/1971 | Coraccio et al. | 333/103 |
| 3,668,662 | 6/1972 | Zimmerman et al. | 333/150 X |
| 3,855,556 | 12/1974 | Hartmann | 310/313 C |
| 3,982,113 | 9/1976 | Coldren | 333/150 |
| 4,013,834 | 3/1977 | Kino et al. | 333/152 X |
| 4,021,657 | 5/1977 | Auld | 333/150 X |
| 4,021,761 | 5/1977 | Morii et al. | 310/313 B X |
| 4,023,120 | 5/1977 | Hartmann | 333/152 X |
| 4,024,480 | 5/1977 | Reeder et al. | 333/70 T |
| 4,097,825 | 6/1978 | Gerard | 333/30 R |
| 4,099,146 | 7/1978 | De Vries | 333/30 R |
| 4,100,498 | 7/1978 | Alsup et al. | 328/14 |
| 4,207,545 | 6/1980 | Grudkowski et al. | 333/150 |

FOREIGN PATENT DOCUMENTS 0082521 6/1980 Japan ............................. 333/81 R

OTHER PUBLICATIONS

Harvey et al., "Linear PIN diodes . . . Attenuator", Monitor, vol. 37, No. 1, Jan./Feb., 1976, pp. 11–12.

Primary Examiner—Eugene R. LaRoche
Assistant Examiner—Seung Ham
Attorney, Agent, or Firm—William Stepanishen; Donald J. Singer

[57] ABSTRACT

A variable analog delay line apparatus utilizing a plurality of tapped SAW devices that are connected in series by single pole multi-throw switch units. The amount of delay is determined by the switch throw arm of the switch unit that is associated with the SAW device. The delay times are added serially to obtain the needed delay.

5 Claims, 2 Drawing Sheets

VARIABLE ANALOG DELAY LINE

STATMENT OF GOVERNMENT INTEREST

The invention described herein may be manufactured and used by or for the Government for governmental purposes without the payment of any royalty thereon.

BACKGROUND OF THE INVENTION

The present invention relates broadly to delay lines in ECM systems, and in particular to a variable analog delay line.

There are several types of microwave delay mechanizations employed in ECM systems. One type of delay utilizes a conventional microwave memory loop, whereby a relatively broadband oscillator loop is loced at comb frequencies near the frequency of the incoming signal, and energy is switched out of the loop at appropriate delay times. Loop bandwidths are typically greater than several Gigahertz and the operation is noncoherent.

Another type of microwave delay first digitizes the incoming analog signal and then stores it in some form of digital memory. The stored signal is read out when desired. If the incoming signal is pulsed and sufficient memory is available, the memorized signal output replicates the frequency and phase response of the input signal. Unfortunately, this type of delay device works best on only one signal pulse train at a time, and high duty cycle input signals can completely tie up the unit, thereby not allowing it to be time shared for the storage of other signals. It is possible to parallel several of these digital memory devices in order to handle more input signals, but the high cost of an individual device usually precludes this luxury. It should also be noted that successful operation of relatively wideband digital memory devices is unproven in production of ECM systems, and the effect of spurious sidebands is yet to be determined.

The state of the art of delay line devices is well represented and alleviated to some degree by the prior art apparatus and approaches which are contained in the following U.S. Patents:

U.S. Pat. No. 4,024,480 issued to Reeder et al on May 17, 1977;
U.S. Pat. No. 4,097,825 issued to Gerard on June 27, 1978;
U.S. Pat. No. 4,099,146 issued to DeVries on July 4, 1978;
U.S. Pat. No. 4,100,498 issued to Alsup et al on July 11, 1978 and
U.S. Pat. No. 4,207,545 issued to Grudkowski et al on June 10, 1980.

The Reeder et al references discloses a surface acoustic wave tapped delay line that is programmable, both in amplitude and phase, to provide a general transversal filter apparatus in which a plurality of nonlinear frequency mixers, each responsive to the sensed signals from a corresponding one of the transducer taps for providing signal manifestations of the sum and difference frequencies of the surface acoustic waves impinging on the tap, each providing the signal magnifestation at a signal amplitude which is selectively adjustable to provide a desired transducer tap weighting and at a selected one of two phases which are displaced by 180°, the signal manifestations from each of the nonlinear frequency mixers being summed along a common signal line.

The Gerard reference provides a surface wave tapped delay line which utilizes spaced tapping output transducers disposed in the path of surface acoustic wave energy propagating along a planar substrate surface from an input transducer.

The DeVries reference describes an acoustic wave storage convolver which includes a plurality of sampling transducers coupled to a surface wave propagating medium along a path defined by a pair of opposedly disposed input transducers.

The Alsup et al reference relates to surface acoustic wave sampled data filters which can be utilized as serial access read-only memories to directly implement at carrier frequencies a coherent fast-frequency-hop synthesizer in the VHF and UHF ranges.

The Grudkowski eta l reference discloses a linear SAW signal processor apparatus which utilizes a plurality of taps of a SAW delay line which are each connected to a corresponding electronic device having a linear RF output voltage to DC bias current relationship, to provide corresponding output signal trains of RF signal chips, the amplitude of which is linearly related to a DC signal corresponding to the related tap and used for biasing the one of said devices associated therewith.

In FIG. 1 there is shown a typical prior art electronic countermeasure (ECM) delay circuit configuration, in which the input RF signal is first downconverted (through several downconversion stages) to the instantaneous bandwidth of a memory or delay device, stored or delayed for a specified period of time, and subsequently read out and upconverted to the original RF frequency. Because the RF delay must usually be available over an extremely large bandwidth, it is desired that the instantaneous bandwidth of the memory or delay device be as broad as possible. Narrow delay bandwidths require more parallel downconversion paths or at least more local oscillators and switches in order to fold the entire RF range into the delay bandwidth. In general, a practical ECM application would require that memory should be at least 400 MHz wide to be feasible for an ECM system.

SUMMARY OF THE INVENTION

The present invention utilizes surface acoustic wave (SAW) devices in conjunction with single pole multiple throw switches to form a delay line configuration which provide variable time delays in stepped minimum delay increments. The SAW devices which are tapped, may be switched to provide different length delays. A series/shunt diode circuit is utilized to terminate each SAW tap and thereby provide the proper match for the taps whether they connected a load or not.

It is one object of the present invention, therefore, to provide an improved variable analog delay line.

It is another object of the invention to provide an improved variable analog delay line that utilizes tapped SAW delay lines in a relatively low cost configuration to meet the requirements of a critical ECM application.

It is a further object of the invention to provide an improved variable analog delay line that permits unwanted SAW delay taps to be shorted to ground and the used tap to be well matched to its load.

It is yet another object of the invention to provide an improved variable analog delay line that minimizes the number of SAW Delay taps in order to minimize triple transit effects.

It is an even further object of the invention to provide an improved variable analaog delay line that permits maximum crosstalk values to be met while still meeting typical system requirements.

It is yet another object of the invention to provide an improved variable analog delay line that utilizes conventional delay lines for the smaller delay increments and permits the flexibility of later decreasing the minimum delay increment.

These and other advantages, objects and features of the invention will become more apparent after considering the following description taken in conjunction with the illustrative embodiment in the accompanying drawings.

DESCRIPTION OF THE INVENTION

Figure 1:
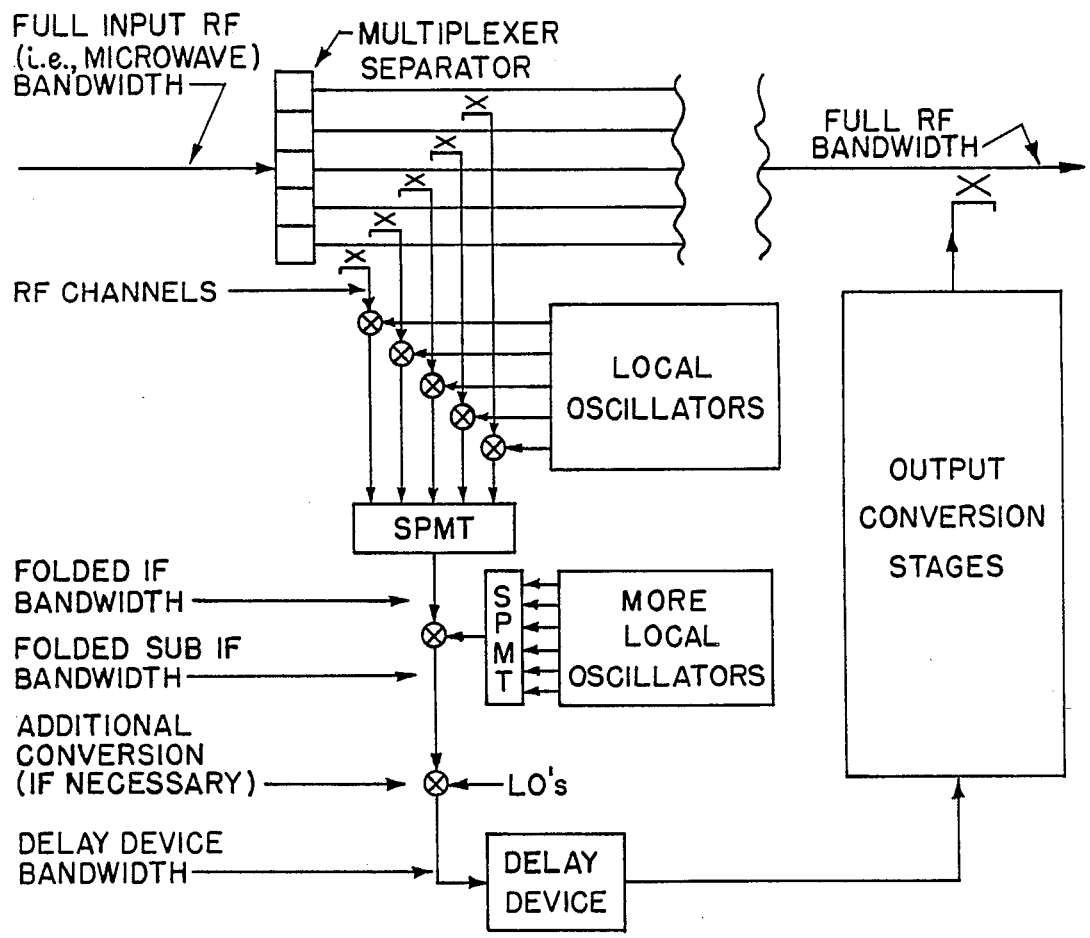
FIG. 1 is a block diagram of a typical prior art ECM delay circuit configuration.

The variable delay line apparatus provides an RF memory device with variable delay that can preserve the phase information of the input signals. The apparatus provides a variable delay that is analog. Thus, when the apparatus is set to a given value, it provides the same delay for all the signal inputs which means it can handle multiple input signals. These input signals may each be of relatively high duty cycle and pulse repetition frequency (PRF). Since this delay apparatus is intended to be used only against medium PRF signals, the maximum delay times are only required to be moderate. Moreover, the memory device is relatively low cost so it can be used as a complement to the digital device described above in FIG. 1. The digital device will provide longer delay times for lower duty cycle input signals, while the present invention will be used against (possibly simultaneous) high duty cycle, medium PRF threats.

Figure 2:
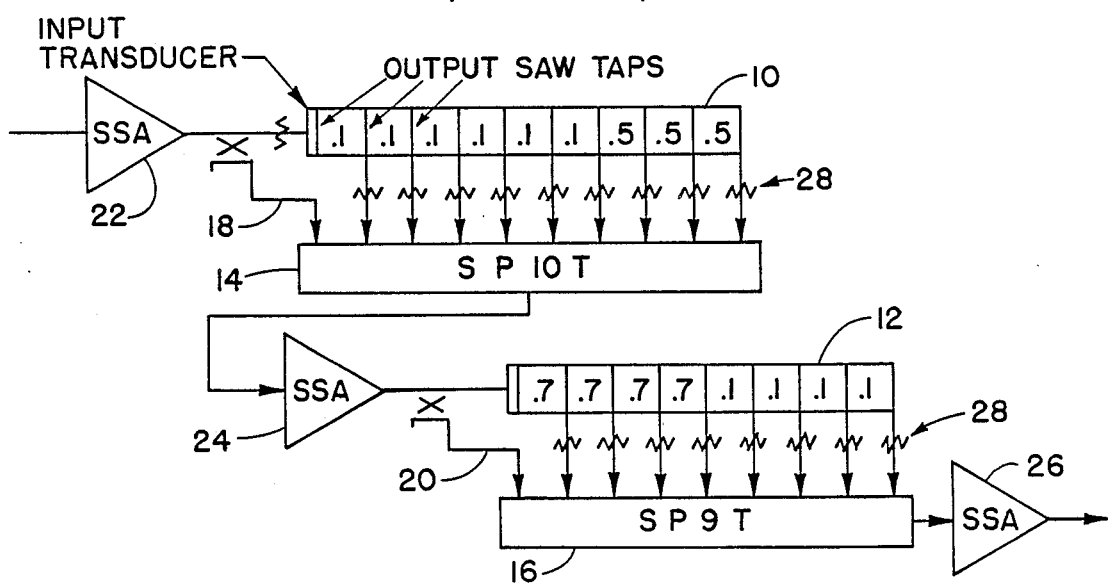
FIG. 2 is a block diagram of the variable anglog delay line apparatus according to the present invention.

Turning now to FIG. 2, there is shown a pair of tapped surface acoustic wave (SAW) delay line units 10, 12 which are used in conjunction with a pair of single pole multithrow switch units 14, 16. The number of throws on the switch unit are directly related to the number of taps on the SAW delay lien that it is connected to. The amount of signal delay that is provided is determined by which switch conneciton on the respective switch unit 14, 16 is thrown. The various switch positions on the switch units 14, 16 include a delay bypass path 18, 20 for each SAW delay line unit 10, 12. Thus, the amount of signal delay may be varied from zero to 5.3 microseconds in 0.1 microsecond steps. It may be noted that different delay times may be arranged between adjacent taps on the SAW delay units thereby controlling the delay increments as well as the total delay range.

In general, the operating bandwidth for a typical ECM application is 500 to 900 MHz, and SAW devices have already been demonstrated to work well over these frequencies under MIL spec conditions. Moreover, the triple-transit-suppression requirement that is imposed upon the SAW device of more than 30 dB (in order to keep loss variation for each device across the band below 0.5 dB), has already been demonstrated. In addition, the relatively high loss of each delay line unit which is approximatley 32 dB, is compensated by the use of existing, commercially available, relatively inexpensive, solid state amplifiers (SSA's) 22, 24, 26. Thus, by distributing the gain between the relatively high loss SAW delay units 10, 12, the effect on a typical ECM system noise figure, dynamic range, etc., is negligible. Furthermore, overall switching speeds less than 50 nanoseconds are achievable for the entire device, and, thus, typical system time-sharing requirement are satisfied.

It should also be clearly understood and noted that the above stated variable analog delay requirements apparently cannot be met with any other known practical mechanization or circuit configuration at this point in time. Moreover, the generation of variable analog delays by using the combination of tapped SAW delay line units and single pole multithrow switch units, as shown and described in the embodiment of FIG. 2 is rather unique. The novelty of the present delay apparatus is also greatly enhanced by the unique characteristics of tapped surface acoustic wave devices. A brief description of the specifically required parameters and characteristics of tapped SAW delay line units will be discussed in the following paragraphs.

Thenature of the SAW devices requires that any unused tap be shorted to ground, otherwise signal energy will be reflected to the input transducer by the tap and will produce triple transit signals that are above unacceptable level. In addition, each tap on the SAW delay line presents a relatively poor match (typically as bad as 6:1) to its dedicated switch input. This means that the mismatch uncertainty between different delay states on the same tapped SAW line could be as high as 2 or 3 dB in amplitude, and the total amplitude uncertainty for the entire device will be much higher. An amplitude uncertainty for the entire device of 1 or 2 dB between delays states is probably the maximm tolerable. This amplitude uncertainty can be reduced to acceptable levels by adding a moderate loss 28 in each switch arm between the delay tap and the switch as already shown in FIG. 2. Unfortunately, this standard type of circuit configuration does not permit the tap to be shorted to ground when the tap is not used. This is the ideal operating configuration for an unused tap on a SAW device.

Figure 3:
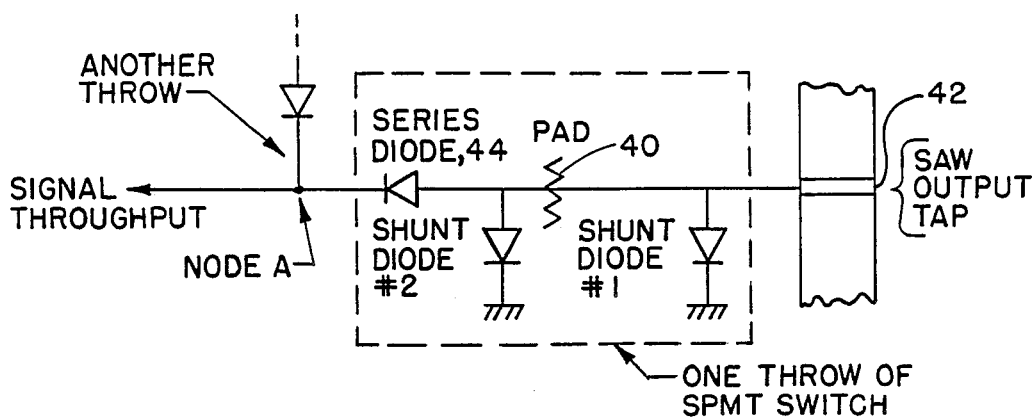
FIG. 3 is a schematic diagram of the switching circuit that is connected to the SAW output tap.

The problem of both maintaining a good match between the SAW device and the switch when a particular tap is used, and shorting the tap to ground when the tap is not used, is addressed and solved by the switch design, which is shown in FIG. 3. For convenience, only one arm of the switch unit is shown. The switch arm which is mechanized with a shunt/series diode configuration, and an appropriate moderate loss, 40 pad, is connected to a SAW output tap 42. A pad value of 3 dB satisfies the optimum trade off between good match and acceptable loss. For clarity, standard diode drive lines, RF blocking capacitors, etc., have not been shown. When the indicated arm (i.e., "throw") of the multithrow switch is to be disconnected, which means another switch arm is connected, the series diode 44 is biased off and shunt diode #1 is forward biased to ground in the conventional manner. At the relatively long wavelengths which can be involved, the shunt diode #1 can easily be located a small fraction of a wavelength away from the transducer tap on the SAW device so that the tap sees a dead short. In this mode the pad 40 has little effect. However, the addition of shunt diode #2 may be necessary in order to present the proper match at node A for the switch arm that is actually in use. Shunt diode #2 is simultaneously biased on with shunt diode #1.

In the other operating mode, when the indicated arm is to be connected to the associated SAW tap, shunt diode #1 is biased off (i.e., open to ground) and the series diode 44 is biased on. The tap is then connected through the switch path via the matching pad 40.

Figure 4:
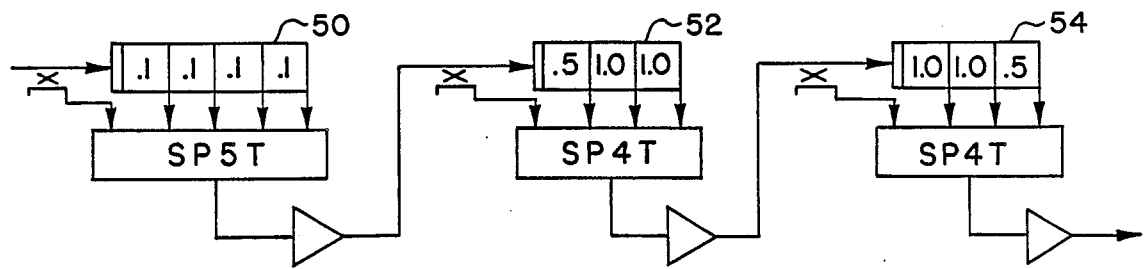
FIGS. 4, 5 and 6 are block diagrams, respectively, illustrating typical delay line circuit configuratins with different delay ranges.

Turning now to FIG. 4, there is shown a tapped SAW delay line circuit which is particularly useful and unique in its operation to minimize triple transit leakage. The circuit that is shown in FIG. 4 that employs a minimum number of taps on each of the SAW delay units 50, 52, 54 in order to minimize triple transit leakage while still meeting the system minimum delay requirement. For clarity, all the solid state amplifiers have not been shown. It may be noted that the specific delay times on each SAW delay unit may be chosen as needed or desired.

Figure 5:
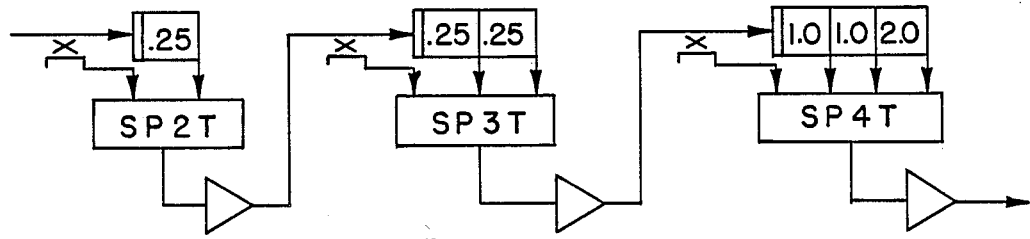
Figure 6:
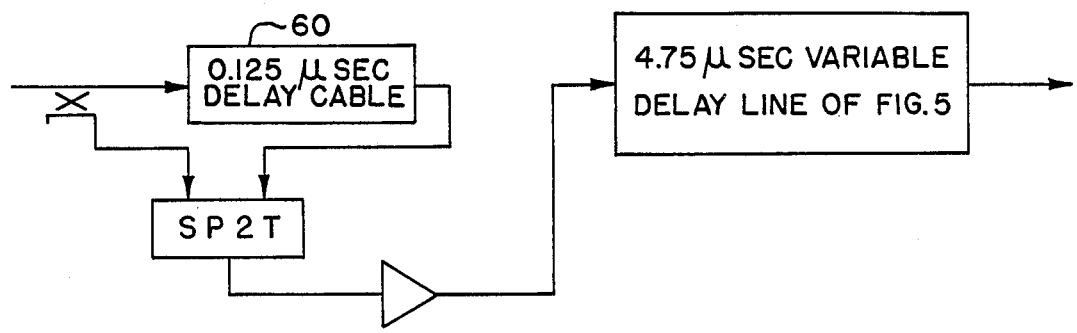

In FIG. 5 there is disclosed an alternative embodiment which reduces the crosstalk between the input transducer to the SAW device and the output transducers at the various taps. The crosstalk which is especially critical, is between the input transducer and the closest (i.e., the minimum delay) tap. Although SAW devices have been built with delays as short as 0.04 microseconds at the frequencies of interest, the crosstalk that was achieved has been only −10 dBc. Because the maximum value of crosstalk must be of the same order as that value which is allowed for triple transit leakage, namely −30 dBc maximum, the minimum delay increments may have to be increased beyond the 0.1 microsecond value. The variable analog delay line apparatus that is shown in FIG. 5 satisfies both the crosstalk demands as well as the system requirements. If it is necessary to decrease the smallest delay increment at a later time, the circuit configuration that is shown in FIG. 6 will accomplish that purpose. This delay circuit utilizes a 0.125 microsecond delay which is obtained by a more conventional means, such as a conventional microwave loop memory cable delay line 60. Since delay cables possess relatively low loss at the frequencies of interest, it may be utilized in conjunction with the delay circuit that is shown in FIG. 5 to provide the above-stated smallest delay increment.

Although the invention has been described with reference to a particular embodiment, it will be understood to those skilled in the art that the invention is capable of a variety of alternative embodiments within the spirit and scope of the appended claims.

What is claimed is:

1. A variable analog delay line apparatus comprising in combination:
    a plurality of SAW delay line units respectively connected to each other to form a series circuit, the first SAW delay line unit of said plurality of SAW delay line units receiving an input signal and the last SAW delay line unit of said plurality of SAW delay line units outputting the delayed signal, said delayed signal comprising the input signal that is delayed by the delay time that is set in each of said plurality of SAW delay line units, said delay time in each of said plurality of SAW delay line units is variable between zero delay and some predetermined delay time, and
    a plurality of solid state amplifier units to compensate for the signal amplitude loss that occurs in each of said plurality of SAW delay line units, said plurality of solid state amplifier units are connected respectively to the input of said plurality of SAW delay line units and a final solid state amplifier unit is connected to the output of said last SAW delay line unit, each SAW delay line unit of said plurality of delay line units comprises in combination:
    a surface acoustic wave device having an input transducer to receive said input signal and a plurality of output taps, said surface acoustic wave device providing a different linear delay time between said input transducer and each of said plurality of output taps, said delay time comprising a predetermined number of delay increments, and
    a means for switching operatively connected to said surface acoustic wave device, said switching means having an output arm and a plurality of input arms which are respectively connected to said plurality of output taps, said plurality of input arms being mutually exclusive switchable to said output arm such that if one input arm is connected to said output arm the remaining input arms are disconnected from said output arm, one of said plurality of input arms operatively coupled to said input transducer to provde a signal bypass path for said input signal, if selected, to said output arm, and
    a plurality of impedance matching pads respectively connected between said plurality of input arms and said plurality of output taps.

2. A variable analog delay line apparatus as described in claim 1 wherein only one input arm of said plurality of input arms is connected to said output arm.

3. A variable analog delay line apparatus as described in claim 1 wherein each input arm of said plurality of input arms comprises in combination:
    a first diode operatively connected between its respective impedance matching pad and said output arm,
    a second diode operatively connected ground and the junction of said impedance matching pad and said output tap, and
    a third diode operatively connected between ground and the junction of said first diode and said impedance matching pad.

4. A variable analog delay line apparatus as described in claim 3 wherein said impedance matching pad provides a loss of 3 db.

5. A variable analog delay line apparatus as described in claim 3 wherein said plurality of taps which are not being utilized are shorted to ground and the tap which is utilized is matched to the load.

* * * * *